(12) United States Patent
Takatsu (10) Patent No.: US 6,239,643 B1
(45) Date of Patent: *May 29, 2001

(54) OFFSET CORRECTION CIRCUIT AND DC AMPLIFICATION CIRCUIT

(75) Inventor: Tatsuhiko Takatsu, Tokyo (JP)

(73) Assignee: Ando Electric Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/159,121

(22) Filed: Sep. 23, 1998

(30) Foreign Application Priority Data

Sep. 24, 1997 (JP) .................................................... 9-259045

(51) Int. Cl.$^7$ ...................................................... G06G 7/18
(52) U.S. Cl. ............................................ 327/307; 327/336
(58) Field of Search ................................... 327/307, 336, 327/341, 167, 552, 558

(56) References Cited

U.S. PATENT DOCUMENTS

| | | | |
|---|---|---|---|
| 4,453,132 | * 6/1984 | Stamler | 330/107 |
| 5,519,328 | * 5/1996 | Bennett | 327/362 |
| 5,576,658 | * 11/1996 | Hushimi et al. | 327/552 |
| 5,646,569 | * 7/1997 | Bruhns et al. | 327/307 |
| 5,659,269 | * 8/1997 | Myers | 327/156 |
| 5,663,680 | 9/1997 | Nordeng | 330/9 |

FOREIGN PATENT DOCUMENTS

| | | | |
|---|---|---|---|
| 0 744 829 A1 | 11/1996 | (EP) | H03H/1/00 |
| 0 758 162 A2 | 2/1997 | (EP) | H03F/1/30 |

* cited by examiner

Primary Examiner—Timothy P. Callahan
Assistant Examiner—Terry L. Englund
(74) Attorney, Agent, or Firm—Finnegan, Henderson, Farabow, Garrett & Dunner, L.L.P.

(57) ABSTRACT

An offset correction circuit containing an integrator is provided between an output of a first DC amplifier and an input of a second DC amplifier, and the integrator corrects not only an offset error caused by an input signal in the first DC amplifier, but also an offset error caused by an input signal in the second DC amplifier. Thus, the effect of the offset error proportional to the integral value of the input signal strength, occurring depending on the temperature stability or power supply voltage variation rate resulting from the input signal in the two DC amplifiers can be canceled.

14 Claims, 2 Drawing Sheets

OFFSET CORRECTION CIRCUIT AND DC AMPLIFICATION CIRCUIT

BACKGROUND OF THE INVENTION

1. Field of the Invention

This invention relates to an offset correction circuit for correcting an offset error caused by an input signal of a DC amplifier and a DC amplification circuit including the offset correction circuit.

2. Description of the Related Art

In a conventional DC amplifier for amplifying an input signal and outputting the amplified signal, it is ideal that if an input signal is 0, an output signal becomes 0. However, if just after an input signal of a large amplitude is added, it is set to 0, an output signal does not become 0 and an offset error caused by the input signal occurs. Some offset errors caused by the input signal continue for 10 milliseconds to several ten seconds; the cause of continuation of the offset error for a long time may depend on temperature stability and power supply voltage variation rate.

Figure 5:
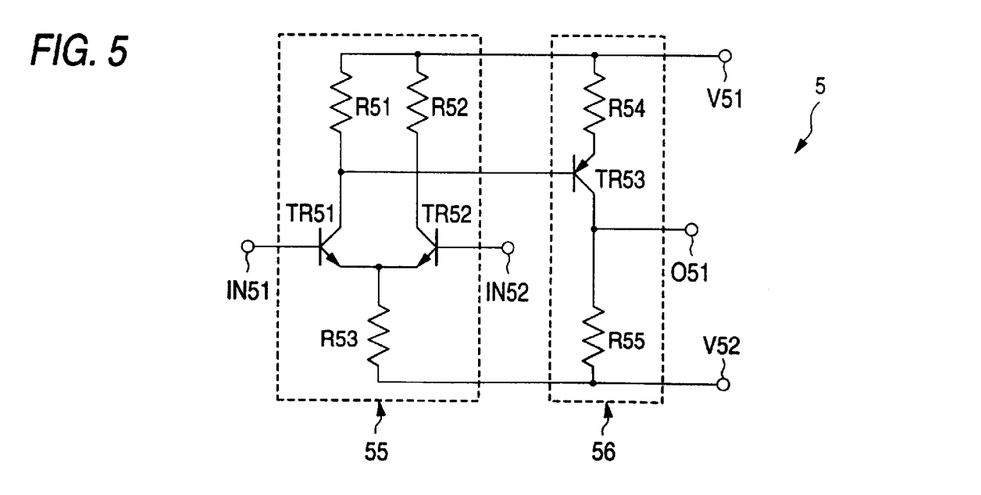
FIG. 5 is a diagram to show a basic circuit configuration of a conventional DC amplifier.

FIG. 5 is a basic circuit diagram of a DC amplifier. First, occurrence of an offset error depending on the temperature stability resulting from an input signal will be discussed. In FIG. 5, a DC amplifier 5 is made up of a differential amplifier 55 and a voltage amplifier 56. The differential amplifier 55 consists of transistors TR51 and TR52 and resistors R51, R52, and R53. The voltage amplifier 56 consists of a transistor TR53 and resistors R54 and R55. A positive input terminal IN51 is connected to a base of the transistor TR51 and a negative input terminal IN52 is connected to a base of the transistor TR52. An output terminal O51 is connected to the resistor R55. A positive power supply is connected to a power supply input terminal V51 and a negative power supply is connected to a power supply input terminal V52.

A signal is input through the positive input terminal IN51 or the negative input terminal IN52 and is output to the output terminal O51. Normally, a part of signal output from the output terminal O51 is fed back into the negative input terminal IN52, but not fed back in FIG. 5 for simplicity. The transistors TR51 and TR52 are of the same structure and characteristics and the resistors R51 and R52 are of the same resistance value. Further, if the applied voltage to the positive input terminal IN51 is set to 0 and the negative input terminal IN52 is grounded, the current flowing into the resistors R51 and R52 is reduced to half the current flowing into the resistor R53, and the characteristics of the transistor TR53 and the resistor R55 are adjusted so that the voltage of the output terminal O51 becomes 0.

First, when a positive voltage is applied to the positive input terminal IN51, in the differential amplifier 55, a collector current of the transistor TR51 increases and a collector current of the transistor TR52 decreases. As the collector current of the transistor TR51 increases, the voltage of the resistor R51 increases and the collector-emitter voltage of the transistor TR51 decreases. Normally, to widen the differential input range, the collector-emitter voltage of the transistor TR51 or TR52 is large as compared with the voltage of the resistor R51 or R52. Thus, the decrease rate of the collector-emitter voltage of the transistor TR51 is small as compared with the increase rate of the current of the transistor TR51. Therefore, power consumption of the transistor TR51 is increased and the device temperature of the transistor TR51 rises. Since power consumption of the transistor TR52 is decreased and the device temperature of the transistor TR52 lowers, the temperature of the transistor TR51 becomes higher than that of the transistor TR52. The temperature difference between the transistors TR51 and TR52 is as in the following expression (1):

$$\frac{1}{Q(51)}\int \left(P(51) - \frac{\Delta T(51)}{\theta(51)}\right)dt - \frac{1}{Q(52)}\int \left(P(52) - \frac{\Delta T(52)}{\theta(52)}\right)dt$$

where

Q(51), Q(52): Heat capacity of transistor TR51, TR52,

P(51), P(52): Heating value of transistor TR51, TR52, $\Delta T(51)$, $\Delta T(52)$: Temperature difference between device of transistor TR51, TR52 and environment, and $\theta(51)$, $\theta(52)$: Heat resistance between device of transistor TR51, TR52 and environment.

Next, the applied voltage to the positive input terminal IN51 is set to 0. If there is no temperature difference between the transistors TR51 and TR52, the currents flowing into the resistors R51 and R52 become the same and the voltage of the output terminal O51 becomes 0. However, since the temperature of the transistor TR51 is higher than that of the transistor TR52 as described above, the base-emitter voltage of the transistor TR51 becomes smaller than the base-emitter voltage of the transistor TR52. Thus, the base current of the transistor TR51 becomes larger than the base current of the transistor TR52 and the collector current of the transistor TR51 becomes larger than the collector current of the transistor TR52. As the collector current of the transistor TR51 becomes larger than the collector current of the transistor TR52, the voltage of the resistor R51 becomes larger than the voltage of the resistor R52 and a positive offset error voltage occurs at the output terminal O51.

The offset error voltage occurring at the output terminal O51 is caused by the temperature difference between the transistors TR51 and TR52; the cause of temperature difference occurrence between the transistors TR51 and TR52 is eliminated already by setting the applied voltage of the positive input terminal IN51 to 0, but the temperature difference caused by the power consumption difference between the transistors TR51 and TR52 when a potential difference occurs between the positive input terminal IN51 and the negative input terminal IN52 is accumulated because of the heat capacities of the transistors TR51 and TR52. The accumulated temperature difference gradually lessens according to the condition under which P(51) and P(52) in Expression (1) become the same. As the temperature difference lessens, the offset error voltage occurring at the output terminal O51 also lessens. When the temperature difference between the transistors TR51 and TR52 is eliminated, the offset error occurring at the output terminal O51 is also eliminated.

As described above, in the conventional DC amplifier 5, the temperature stability is degraded because of temperature variation of the components of the DC amplifier 5 caused by the input signal and an offset error occurs.

Next, occurrence of an offset error because of power supply voltage variation caused by an input signal in the DC amplifier 5 will be discussed. First, power supply voltage variation caused by an input signal will be discussed. In FIG. 5, if the voltage of the output terminal O51 of the DC amplifier 5 is positive, the collector current of the transistor TR53 grows as compared with the case where the voltage of the output terminal O51 is 0. Thus, the power supply current of the positive power supply input terminal V51 and the negative power supply input terminal V52 grows; the current flowing out through the output terminal O51 flows out from the positive power supply input terminal V51 via the transistor TR53 to the output terminal O51 and the current flowing in through the output terminal O51 flows into the negative power supply input terminal V52 via the resistor R55 from the output terminal O51. Therefore, output of the DC amplifier 5 changes with the input voltage, thus the power supply current varies with the input voltage and if the power supply current varies, variation of the power supply voltage commensurate with output resistance of the power supply connected to the DC amplifier 5 occurs. The power supply voltage variation caused by the input signal thus occurs.

Next, occurrence of an offset error because of power supply voltage variation in the DC amplifier 5 will be discussed. In FIG. 5, the applied voltage of the positive input terminal IN51 is set to 0 and the differential amplifier 55 consisting of the transistors TR51 and TR52 and the resistors R51, R52, and R53 is placed in an equilibrium state. The transistor TR53 operates so as to adjust the collector current of the transistor TR53 so that the voltage of the resistor R51 becomes equal to the base-emitter voltage of the transistor TR53 plus the voltage of the resistor R54. If the voltage generated at the resistor R55 by the collector current of the transistor TR53 is equal to the voltage of the negative power supply input terminal V52, the voltage of the output terminal O51 becomes 0.

Next, if the negative power supply input terminal V52 varies and the voltage thereof is reduced to half, the voltage of the resistor R53 is reduced to about half because the positive input terminal IN51 and the negative input terminal IN52 are at ground potential. When the voltage of the resistor R53 is reduced to about half, the current of the resistor R53 is reduced to half and the current flowing into the resistors R51 and R52 is reduced to half. The voltage of the resistor R51 is reduced to half and the transistor TR53 operates so as to adjust the collector current of the transistor TR53 so that the voltage of the resistor R51 becomes equal to the base-emitter voltage of the transistor TR53 plus the voltage of the resistor R54. Thus, the base-emitter voltage of the transistor TR53 plus the voltage of the resistor R54 is reduced to half.

Since the base-emitter voltage of the transistor TR53 is not proportional to the emitter current of the transistor TR53 and is almost constant, if the base-emitter voltage of the transistor TR53 plus the voltage of the resistor R54 is reduced to half, the voltage of the resistor R54 is lessened to half or less. This means that the current flowing between the collector and emitter of the transistor TR53 is lessened to half or less and the voltage of the resistor R55 is lessened to half or less. When the voltage of the resistor R55 is lessened to half or less, the voltage of the output terminal O51 becomes the voltage difference between the resistor R55 and the negative power supply input terminal V52, thus a negative offset error occurs.

Thus, variation of the power supply current of the DC amplifier 5 is caused by the input signal and as the power supply current varies, the power supply voltage varies. When the power supply voltage varies, an offset error occurs in the DC amplifier 5. Therefore, in the DC amplifier 5, an offset error occurs because of the power supply voltage variation caused by the input signal. Hitherto, to suppress power supply voltage variation caused by power supply current variation, a capacitor has been added to the power supply connected to the DC amplifier 5; the power supply current variation is replaced with charge/discharge of the capacitor of the power supply and the power supply voltage is proportional to the charge amount accumulated in the capacitor and thus proportional to the change amount integral value of the power supply current. Therefore, the power supply voltage variation caused by the input signal is proportional to the integral value of the charge amount accumulated in the capacitor, thus the offset error occurring because of the power supply voltage variation is proportional to the integral value of the input signal strength.

Thus, in the conventional DC amplifier, an offset error occurs depending on the temperature stability or power supply voltage variation rate resulting from an input signal. The offset error is proportional to the integral value of the input signal strength.

SUMMARY OF THE INVENTION

It is therefore an object of the invention to provide an offset correction circuit for predicting an offset error from the input signal strength in a DC amplifier of known electric characteristics and a known structure and generating a signal for canceling the offset error, thereby correcting the offset error caused by the input signal, and a high-accurate DC amplification circuit including the offset correction circuit.

According to the invention, there is provided an offset correction circuit for correcting an offset error occurring in an output signal from a DC amplification circuit comprising a plurality of DC amplifiers connected at a plurality of stages and a match resistor connected between output and input stages of the DC amplifiers, the offset correction circuit comprising: an integrator for performing predetermined integration processing for integrating a separation signal separated from an output signal from the DC amplifier at a preceding stage to generate a correction signal and outputting the correction signal to the input stage of the DC amplifier at a following stage, the integrator being connected between the output stage of the DC amplifier at the preceding stage and the input stage of the DC amplifier at the following stage, wherein the correction signal output from the integrator is combined with an input signal input from the DC amplifier at the preceding stage via the match resistor to the DC amplifier at the following stage so that an offset error occurring in an output signal of the DC amplification circuit, caused by the input signal to each DC amplifier is corrected.

There is provided an offset correction circuit for correcting an offset error occurring in an output signal from a DC amplification circuit comprising a plurality of DC amplifiers connected at a plurality of stages and a match resistor connected between output and input stages of the DC amplifiers, the offset correction circuit comprising: an integrator for performing predetermined integration processing for integrating a separation signal separated from an input signal to the DC amplifier at a preceding stage to generate a correction signal and outputting the correction signal to the input stage of the DC amplifier at a following stage, the integrator being connected between the input stage of the DC amplifier at the preceding stage and the input stage of the DC amplifier at the following stage, wherein the correction signal output from the integrator is combined with an input signal input from the DC amplifier at the preceding stage via the match resistor to the DC amplifier at the following stage so that an offset error occurring in an output signal of the DC amplification circuit, caused by the input signal to each DC amplifier is corrected.

There is provided an offset correction circuit for correcting an offset error occurring in an output signal from a DC amplification circuit comprising a plurality of DC amplifiers connected at a plurality of stages and a match resistor connected between output and input stages of the DC amplifiers, the offset correction circuit comprising: an integrator for performing predetermined integration processing for integrating a separation signal separated from an output signal from the DC amplifier at a preceding stage to generate a correction signal and outputting the correction signal to the output stage of the DC amplifier at an intermediate stage, the integrator being connected between the output stage of the DC amplifier at the preceding stage and the input stage of the DC amplifier at the following stage, wherein the correction signal output from the integrator is combined with an input signal input from the DC amplifier at the intermediate stage via the match resistor to the DC amplifier at the following stage so that an offset error occurring in an output signal of the DC amplification circuit, caused by the input signal to each DC amplifier is corrected.

There is provided an offset correction circuit for correcting an offset error occurring in an output signal from a DC amplification circuit, the offset correction circuit comprising: an A/D converter for converting an output signal from the DC amplification circuit into a time series numeric signal and outputting the numeric signal, the A/D converter being connected to an output stage of the DC amplification circuit; and a processing unit for performing predetermined integration processing for integrating the time series numeric signal output from the A/D converter to generate a time series correction numeric signal, combining the time series correction numeric signal with the time series numeric signal, and outputting the resultant signal, the processing unit being connected to an output stage of the A/D converter, wherein an offset error occurring in an output signal of the DC amplification circuit, caused by the input signal to the DC amplification circuit is corrected.

There is provided a DC amplification circuit comprising: a plurality of DC amplifiers connected at a plurality of stages; a match resistor connected between output and input stages of the DC amplifiers; and an integrator for performing predetermined integration processing for integrating a separation signal separated from an output signal from the DC amplifier at a preceding stage to generate a correction signal and outputting the correction signal to the input stage of the DC amplifier at a following stage, the integrator being connected between the output stage of the DC amplifier at the preceding stage and the input stage of the DC amplifier at the following stage, wherein an offset error correction function is provided for combining the correction signal output from the integrator with an input signal input from the DC amplifier at the preceding stage via the match resistor to the DC amplifier at the following stage and correcting an offset error occurring in an output signal, caused by the input signal to each DC amplifier.

There is provided a DC amplification circuit comprising: a plurality of DC amplifiers connected at a plurality of stages; a match resistor connected between output and input stages of the DC amplifiers; and an integrator for performing predetermined integration processing for integrating a separation signal separated from an input signal to the DC amplifier at a preceding stage to generate a correction signal and outputting the correction signal to the input stage of the DC amplifier at a following stage, the integrator being connected between the input stage of the DC amplifier at the preceding stage and the input stage of the DC amplifier at the following stage, wherein an offset error correction function is provided for combining the correction signal output from the integrator with an input signal input from the DC amplifier at the preceding stage via the match resistor to the DC amplifier at the following stage and correcting an offset error occurring in an output signal, caused by the input signal to each DC amplifier.

There is provided a DC amplification circuit comprising: a plurality of DC amplifiers connected at a plurality of stages; a match resistor connected between output and input stages of the DC amplifiers; and an integrator for performing predetermined integration processing for integrating a separation signal separated from an output signal from the DC amplifier at a preceding stage to generate a correction signal and outputting the correction signal to the output stage of the DC amplifier at an intermediate stage, the integrator being connected between the output stage of the DC amplifier at the preceding stage and the input stage of the DC amplifier at the following stage, wherein an offset error correction function is provided for combining the correction signal output from the integrator with an input signal input from the DC amplifier at the intermediate stage via the match resistor to the DC amplifier at the following stage and correcting an offset error occurring in an output signal, caused by the input signal to each DC amplifier.

There is provided a DC amplification circuit comprising: a DC amplifier; an A/D converter for converting an output signal from the DC amplifier into a time series numeric signal and outputting the numeric signal, the A/D converter being connected to an output stage of the DC amplifier; and a processing unit for performing predetermined integration processing for integrating the time series numeric signal output from the A/D converter to generate a time series correction numeric signal, combining the time series correction numeric signal with the time series numeric signal, and outputting the resultant signal, the processing unit being connected to an output stage of the A/D converter, wherein an offset error correction function is provided for correcting an offset error occurring in an output signal of the DC amplification circuit, caused by an input signal to the DC amplifier.

DETAILED DESCRIPTION OF THE PREFERRED EMBODIMENTS

Referring now to the accompanying drawings, there are shown preferred embodiments of the invention.
(First Embodiment)

Figure 1:
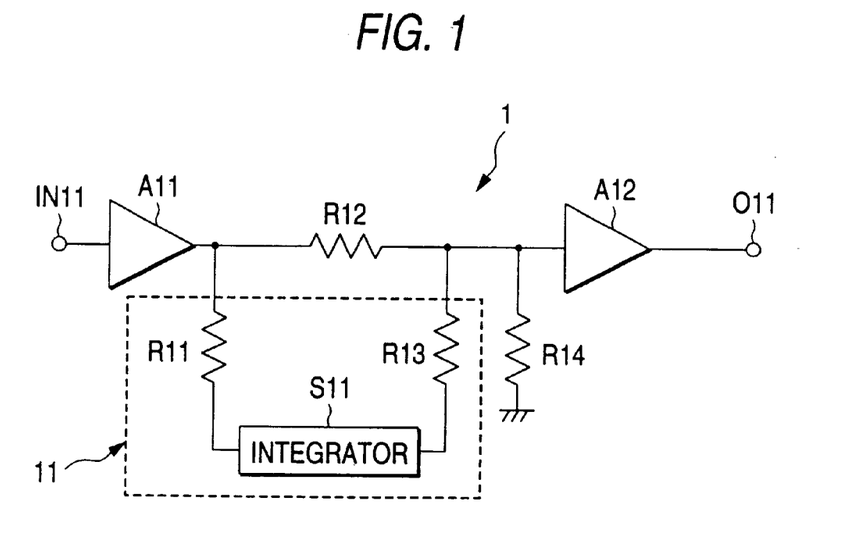
FIG. 1 is a diagram to show a DC amplification circuit including an offset correction circuit of a first embodiment of the invention.

FIG. 1 is a diagram to show a first embodiment of the invention in a DC amplification circuit including an offset correction circuit incorporating the invention.

First, the configuration will be discussed.

FIG. 1 is a diagram to show the circuit configuration of a DC amplification circuit 1 including an offset correction circuit 11 of the first embodiment of the invention. In FIG. 1, the DC amplification circuit 1 is made up of the offset correction circuit 11 consisting of an integrator S11 and resistors R11 and R13, DC amplifiers A11 and A12, and resistors R12 and R14.

The DC amplifier A11 amplifies a signal input through an input terminal IN11 and outputs the amplified signal to the resistor R11 of the offset correction circuit 11 and the resistor R12.

The resistor R12 is connected the to output of the DC amplifier A11 at one end and connected to the input of the DC amplifier A12 at the other end. The resistor R14 is connected to input of the DC amplifier A12 out one end and is grounded at the other end. The resistors R12 and R14 are match resistors for cascading the DC amplifiers A11 and A12. The resistor R12 has a larger impedance than that of the output resistance of the DC amplifier A11.

The offset correction circuit 11, which is made up of the integrator S11 and the resistors R11 and R13, corrects an offset error proportional to the integral value of the input signal strength, occurring depending on the temperature stability or power supply voltage variation rate resulting from an input signal in the DC amplifiers A11 and A12.

The resistor R11 is connected to the input of the integrator S11 in series and the resistor R13 is connected to output of the integrator S11 in series. The series connection of the integrator S11 and the resistor R11, R13 are connected in parallel with the resistor R12 between the output of the DC amplifier A11 and input of the DC amplifier A12. The integrator S11, which has predetermined characteristics, performs integration-based operation processing according to a separation signal input through the resistor R11 and outputs to the resistor R13 a correction signal for canceling an offset error proportional to the integral value of the input signal strength, caused by an input signal in the DC amplifiers A11 and A12.

The DC amplifier A12 amplifies a signal provided by combining a signal from the resistor R12 and the correction signal from the resistor R13 of the offset correction circuit 11, and outputs the amplified signal to an output terminal O11.

Next, the operation of the first embodiment is as follows:
A signal inputted through an input terminal IN11 in FIG. 1 to the DC amplifier A11 is amplified and outputted to the resistor R11 of the offset correction circuit 11 and the resistor R12. The signal inputted to the resistor R12 is outputted to the DC amplifier A12. In the offset correction circuit 11, a separation signal input through the resistor R11 to the integrator S11 is converted by integration-based operation processing into a correction signal for canceling an offset error proportional to the integral value of the input signal strength, occurring depending on the temperature stability or power supply voltage variation rate resulting from the input signal in the DC amplifiers A11 and A12, and the correction signal is output to the resistor R13. The correction signal output through the resistor R13 of the offset correction circuit 11 is combined with the signal output through the resistor R12 and the resultant signal is input to the DC amplifier A12. The signal input to the DC amplifier A12 is amplified and output to the output terminal O11.

If the input and output signals of the integrator S11 are of the same sign, a positive feedback path from the resistor R13 via the resistor R12 to the resistor R11 is produced; the impedance of the resistor R12 is large as compared with the impedance of the output resistance of the DC amplifier A11, thus the feedback amount does not exceed 1 and output of the DC amplifier A11 is little affected by the correction signal from the integrator S11.

As described above, with the offset correction circuit 11 and the DC amplification circuit 1 of the first embodiment, the offset correction circuit 11 containing the integrator S11 is placed between the output of the DC amplifier A11 and the input of the DC amplifier A12 and the integrator S11 corrects not only an offset error caused by the input signal in the DC amplifier A11, but also an offset error caused by the input signal in the DC amplifier A12. Thus, the effect of the offset error proportional to the integral value of the input signal strength, occurring depending on the temperature stability or power supply voltage variation rate resulting from the input signal in the DC amplifiers A11 and A12 can be canceled.

Therefore, in the DC amplification circuit, the offset correction circuit containing the integrator cancels the effect of the offset error occurring depending on the temperature stability or power supply voltage variation rate resulting from the input signal, so that the input signal can be amplified and output with high accuracy.

(Second Embodiment)

Figure 2:
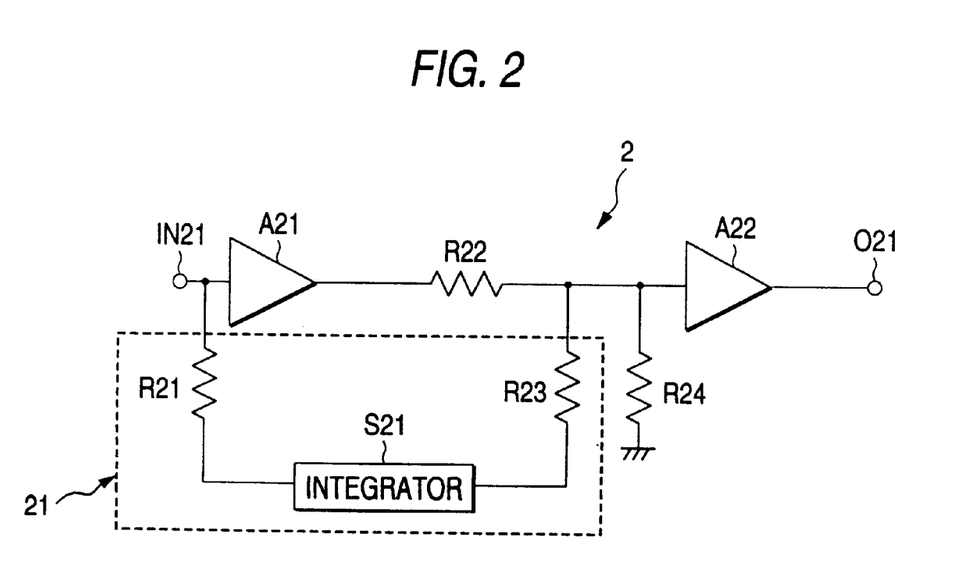
FIG. 2 is a diagram to show a DC amplification circuit including an offset correction circuit of a second embodiment of the invention.

A second embodiment of the invention will be discussed wherein an offset correction circuit containing an integrator for correcting an offset error in two DC amplifiers cascaded as in the DC amplification circuit 1 of the first embodiment is connected in another circuit configuration.

FIG. 2 is a diagram to show a second embodiment of the invention in a DC amplification circuit including an offset correction circuit incorporating the invention.

First, the configuration will be discussed.

FIG. 2 is a diagram to show the circuit configuration of a DC amplification circuit 2 including an offset correction circuit 21 of the second embodiment of the invention. In FIG. 2, the DC amplification circuit 2 is made up of the offset correction circuit 21 consisting of an integrator S21 and resistors R21 and R23, DC amplifiers A21 and A22, and resistors R22 and R24.

The DC amplifier A21 amplifies a signal input through an input terminal IN21 and outputs the amplified signal to the resistor R22.

The resistor R22 is connected to the output of the DC amplifier A21 at one end and connected to the input of DC amplifier A22 at the other end. The resistor R24 is connected to the input of the DC amplifier A22 at one end and is grounded at the other end. The resistors R22 and R24 are match resistors for cascading the DC amplifiers A21 and A22.

The offset correction circuit 21, which is made up of the integrator S21 and the resistors R21 and R23, corrects an offset error proportional to the integral value of the input signal strength, occurring depending on the temperature stability or power supply voltage variation rate resulting from an input signal in the DC amplifiers A21 and A22.

The resistor R21 is connected to the input of the integrator S21 in series and the resistor R23 is connected to output of the integrator S21 in series. The series connection of the integrator S21 and the resistors R21, R23 are connected in parallel with the series connection of the DC amplifier A21 and the resistor R22 between the input of the DC amplifier A21 and the input of the DC amplifier A22. The integrator S21, which has predetermined characteristics, performs integration-based operation processing according to a separation signal input through the resistor R21 and outputs to the resistor R23 a correction signal for canceling an offset error proportional to the integral value of the input signal strength, caused by an input signal in the DC amplifiers A21 and A22.

The DC amplifier A22 amplifies a signal provided by combining a signal from the resistor R22 and the correction signal from the resistor R23 of the offset correction circuit 21, and outputs the amplified signal to an output terminal O21.

Next, the operation of the second embodiment is as follows:

A signal is inputted through an input terminal IN21 in FIG. 2 to the DC amplifier A21 and the resistor R21 of the offset correction circuit 21 and the signal inputted to the DC amplifier A21 is amplified and outputted to the resistor R22. The signal inputted to the resistor R22 is outputted to the DC amplifier A22. In the offset correction circuit 21, a separation signal input through the resistor R21 to the integrator S21 is converted by integration-based operation processing into a correction signal for canceling an offset error proportional to the integral value of the input signal strength, occurring depending on the temperature stability or power supply voltage variation rate resulting from the input signal in the DC amplifiers A21 and A22, and the correction signal is output to the resistor R23. The correction signal output through the resistor R23 of the offset correction circuit 21 is combined with the signal output through the resistor R22 and the resultant signal is input to the DC amplifier A22. The signal input to the DC amplifier A22 is amplified and output to the output terminal O21.

As described above, with the offset correction circuit 21 and the DC amplification circuit 2 of the second embodiment, the offset correction circuit 21 containing the integrator S21 is placed between the input of the DC amplifier A21 and the input of the DC amplifier A22 in parallel with the DC amplifier A21 and the resistor R22, and the integrator S21 corrects not only an offset error caused by the input signal in the DC amplifier A21, but also an offset error caused by the input signal in the DC amplifier A22. Thus, the effect of the offset error proportional to the integral value of the input signal strength, occurring depending on the temperature stability or power supply voltage variation rate resulting from the input signal in the DC amplifiers A21 and A22 can be canceled.

Therefore, in the DC amplification circuit, the offset correction circuit containing the integrator cancels the effect of the offset error occurring depending on the temperature stability or power supply voltage variation rate resulting from the input signal, so that the input signal can be amplified and output with high accuracy.

(Third Embodiment)

Figure 3:
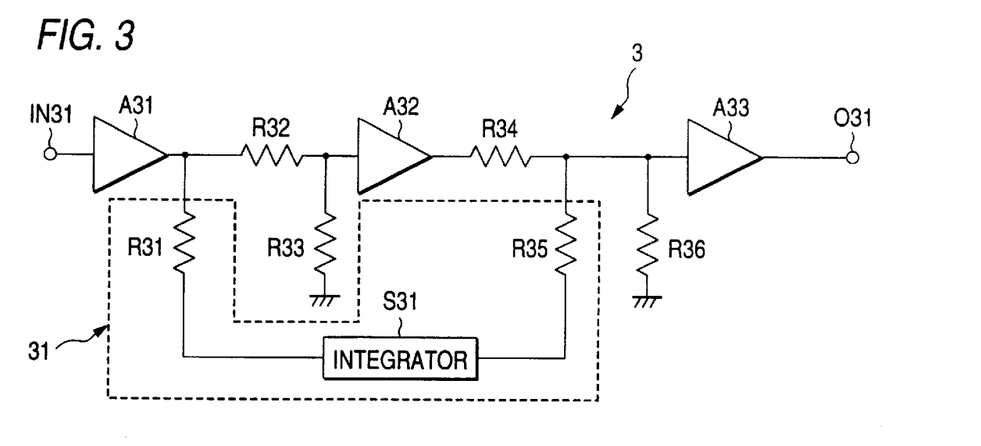
FIG. 3 is a diagram to show a DC amplification circuit including an offset correction circuit of a third embodiment of the invention.

In the first and second embodiments, the DC amplification circuit including the offset correction circuit for correcting an offset error in the two DC amplifiers cascaded has been discussed. In a third embodiment of the invention, a DC amplification circuit using three DC amplifiers cascaded will be discussed.

FIG. 3 is a diagram to show a third embodiment of the invention in a DC amplification circuit including an offset correction circuit incorporating the invention.

First, the configuration will be discussed.

FIG. 3 is a diagram to show the circuit configuration of a DC amplification circuit 3 including an offset correction circuit 31 of the third embodiment of the invention. In FIG. 3, the DC amplification circuit 3 is made up of the offset correction circuit 31 consisting of an integrator S31 and resistors R31 and R35, DC amplifiers A31, A32, and A33, and resistors R32, R33, R34, and R36.

The DC amplifier A31 amplifies a signal input through an input terminal IN31 and outputs the amplified signal to the resistor R32 and the resistor R31 of the offset correction circuit 31.

The resistor R32 is connected to the output of the DC amplifier A31 at one end and connected to the input of the DC amplifier A32 at the other end. The resistor R33 is connected to the input of the DC amplifier A32 at one end and is grounded at the other end. The resistors R32 and R33 are match resistors for cascading the DC amplifiers A31 and A32.

The DC amplifier A32 amplifies a signal input from the resistor R32 and outputs the amplified signal to the resistor R34.

The resistor R34 is connected to the output of the DC amplifier A32 at one end and connected to the input of the DC amplifier A33 at the other end. The resistor R36 is connected to the input of the DC amplifier A33 at one end and is grounded at the other end. The resistors R34 and R36 are match resistors for cascading the DC amplifiers A32 and A33.

The offset correction circuit 31, which is made up of the integrator S31 and the resistors R31 and R35, corrects an offset error proportional to the integral value of the input signal strength, occurring depending on the temperature stability or power supply voltage variation rate resulting from an input signal in the DC amplifiers A31, A32, and A33.

The resistor R31 is connected to the input of the integrator S31 in series and the resistor R35 is connected to the output of the integrator S31 in series. The series connection of the integrator S31 and the resistors R31, R35 are connected in parallel with the circuit branch consisting of the resistor R32, the DC amplifier A32, and the resistor R34 between the output of the DC amplifier A31 and the input of the DC amplifier A33. The integrator S31, which has predetermined characteristics, performs integration-based operation processing according to a separation signal input through the resistor R31 and outputs to the resistor R35 a correction signal for canceling an offset error proportional to the integral value of the input signal strength, caused by an input signal in the DC amplifiers A31, A32, and A33.

The DC amplifier A33 amplifies a signal provided by combining a signal from the resistor R34 and the correction signal from the resistor R35 of the offset correction circuit 31, and outputs the amplified signal to an output terminal O31.

Next, the operation of the third embodiment is as follows:

A signal inputted through an input terminal IN31 in FIG. 3 to the DC amplifier A31 is amplified and outputted to the resistor R31 of the offset correction circuit 31 and the resistor R32. The signal input to the resistor R32 is outputted to the DC amplifier A32. The signal inputted from the resistor R32 to the DC amplifier A32 is amplified and outputted to the resistor R34. The signal input to the resistor R34 outputted to the DC amplifier A33. In the offset correction circuit 31, a separation signal input through the resistor R31 to the integrator S31 is converted by integration-based operation processing into a correction signal for canceling an offset error proportional to the integral value of the input signal strength, occurring depending on the temperature stability or power supply voltage variation rate resulting from the input signal in the DC amplifiers A31, A32, and A33, and the correction signal is output to the resistor R35. The correction signal output through the resistor R35 of the offset correction circuit 31 is combined with the signal output through the resistor R34 and the resultant signal is input to the DC amplifier A33. The signal input to the DC amplifier A33 is amplified and output to the output terminal O31.

As described above, with the offset correction circuit 31 and the DC amplification circuit 3 of the third embodiment, the offset correction circuit 31 containing the integrator S31 is placed between the output of the DC amplifier A31 and the input of the DC amplifier A33 in parallel with the resistor R32, the DC amplifier A32, and the resistor R34, and the integrator S31 corrects not only an offset error caused by the input signal in the DC amplifier A31, but also an offset error caused by the input signal in the DC amplifiers A32 and A33. Thus, the effect of the offset error proportional to the integral value of the input signal strength, occurring depending on the temperature stability or power supply voltage variation rate resulting from the input signal in the DC amplifiers A31, A32, and A33 can be canceled.

Therefore, in the DC amplification circuit, the offset correction circuit containing the integrator cancels the effect of the offset error occurring depending on the temperature stability or power supply voltage variation rate resulting from the input signal, so that the input signal can be amplified and output with high accuracy.

(Fourth Embodiment)

Figure 4:
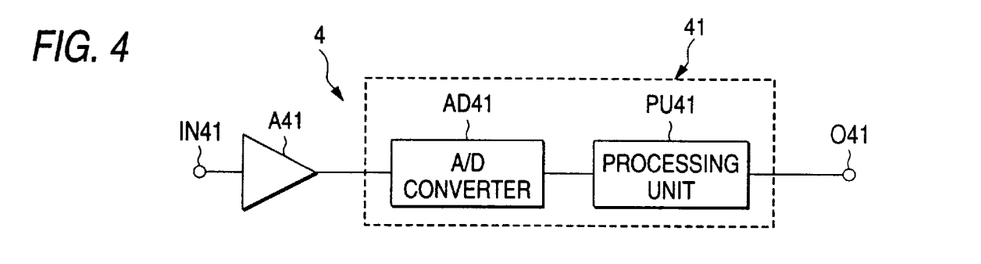
FIG. 4 is a diagram to show a DC amplification circuit including an offset correction circuit of a fourth embodiment of the invention.

In the first to third embodiments, the offset correction circuit uses the integrator. A DC amplification circuit including an offset correction circuit using an A/D converter and a processing unit in a fourth embodiment of the invention will be discussed.

FIG. 4 is a diagram to show a fourth embodiment of the invention in a DC amplification circuit including an offset correction circuit incorporating the invention.

First, the configuration will be discussed.

FIG. 4 is a diagram to show the circuit configuration of a DC amplification circuit 4 including an offset correction circuit 41 of the fourth embodiment of the invention. In FIG. 4, the DC amplification circuit 4 is made up of a DC amplifier A41 and the offset correction circuit 41 consisting of an A/D converter AD41 and a processing unit PU41.

The DC amplifier A41 amplifies a signal input through an input terminal IN41 and outputs the signal containing an offset error to the A/D converter AD41 of the offset correction circuit 41. The offset error occurs depending on the temperature stability or power supply voltage variation rate resulting from the input signal in the DC amplifier A41 and is proportional to the integral value of the input signal strength.

The offset correction circuit 41, which consists of the A/D converter AD41 and the processing unit PU41, corrects an offset error proportional to the integral value of the input signal strength, occurring depending on the temperature stability or power supply voltage variation rate resulting from the input signal in the DC amplifier A41.

The A/D converter AD41, which is connected to the output of the DC amplifier A41, converts the signal containing an offset error input from the DC amplifier A41 into a time series numeric signal and outputs the numeric signal to the processing unit PU41.

The processing unit PU41, which is connected to the output of the A/D converter AD41, performs integration-based operation processing with predetermined order and coefficients to generate a time series correction numeric signal from the time series numeric signal input from the A/D converter AD41, adds the time series correction numeric signal to the time series numeric signal to generate a time series numeric signal for canceling an offset error, and outputs this time series numeric signal to the output terminal O41.

Next, the operation of the fourth embodiment is as follows:

A signal inputted through an input terminal IN41 in FIG. 4 to the DC amplifier A41 is amplified and the amplified signal containing an offset error is outputted to the A/D converter AD41 of the offset correction circuit 41. The signal containing an offset error outputted to the A/D converter AD41 is converted into a time series numeric signal, which is then output to the processing unit PU41. The time series numeric signal inputted to the processing unit PU41 is added to a time series correction numeric signal generated by performing integration-based operation processing with predetermined degree and coefficients, and the resultant signal is output to the output terminal O41 as a time series numeric signal for canceling the offset error.

As described above, with the offset correction circuit 41 and the DC amplification circuit 4 of the fourth embodiment, the offset correction circuit 41 consisting of the A/D converter AD41 and the processing unit PU41 is placed at output of the DC amplifier A41 and the A/D converter AD41 and the processing unit PU41 correct an offset error caused by the input signal in the DC amplifier A41. Thus, the effect of the offset error proportional to the integral value of the input signal strength, occurring depending on the temperature stability or power supply voltage variation rate resulting from the input signal in the DC amplifier A41 can be canceled.

Therefore, in the DC amplification circuit, the offset correction circuit consisting of the A/D converter and the processing unit cancels the effect of the offset error occurring depending on the temperature stability or power supply voltage variation rate resulting from the input signal, so that the input signal can be amplified and output with high accuracy.

In the first to fourth embodiments, in case of cascading the DC amplifiers at multiple stages, the offset correction circuit can also correct an offset error in all the DC amplifiers.

According to the offset correction circuit of the invention, in the DC amplification circuit, the offset correction circuit containing the integrator (or the A/D converter and the processing unit) can cancel the effect of the offset error occurring depending on the temperature stability or power supply voltage variation rate resulting from the input signal.

According to the DC amplification circuit of the invention, the offset correction circuit containing the integrator (or the A/D converter and the processing unit) can cancel the effect of the offset error occurring depending on the temperature stability or power supply voltage variation rate resulting from the input signal, so that the input signal can be amplified and output with high accuracy.

What is claimed is:

1. An offset correction circuit for correcting an offset error occurring in an output signal of a DC amplification circuit comprising first and second DC amplifiers and first and second resistors wherein the offset error is caused by temperature instability or power supply variations, the first resistor is connected between an output of the first DC amplifier and an input of the second DC amplifier, and the second resistor is connected between the input of the second DC amplifier and ground, and the first and second resistors are match resistors for cascading the first and second DC amplifiers, said offset correction circuit comprising:

an integrator for performing predetermined integration processing for integrating a separation signal separated from an output signal from the first DC amplifier to generate a correction signal and outputting the correction signal to the input of the second DC amplifier, said integrator being connected between the output of the first DC amplifier and the input of the second DC amplifier, wherein the correction signal output from the integrator is combined with the output signal from the first DC amplifier and inputted to the second DC amplifier so that the offset error occurring in the output signal of the DC amplification circuit is corrected.

2. The offset correction circuit according to claim 1, further comprising two resistors connected respectively to input and output of said integrator in series.

3. An offset correction circuit for correcting an offset error occurring in an output signal of a DC amplification circuit comprising first and second DC amplifiers and first and second resistors wherein the offset error is caused by temperature instability or power supply variations, the first resistor is connected between an output of the first DC amplifier and an input of the second DC amplifier, and the second resistor is connected between the input of the second DC amplifier and ground, and the first and second resistors are match resistors for cascading the first and second DC amplifiers, said offset correction circuit comprising:

an integrator for performing predetermined integration processing for integrating a separation signal separated from an input signal to the first DC amplifier to generate a correction signal and outputting the correction signal to the input of the second DC amplifier, said integrator being connected between the input of the first DC amplifier and the input of the second DC amplifier, wherein the correction signal output from the integrator is combined with an output signal from the first DC amplifier and inputted to the second DC amplifier so that the offset error occurring in the output signal of the DC amplification circuit is corrected.

4. The offset correction circuit according to claim 3, further comprising two resistors connected respectively to input and output of said integrator in series.

5. An offset correction circuit for correcting an offset error occurring in an output signal of a DC amplification circuit comprising first, second, and third DC amplifiers and first, second, third, and fourth resistors wherein the offset error is caused by temperature instability or power supply variations, the first resistor is connected between an output of the first DC amplifier and an input of the second DC amplifier, the second resistor is connected between the input of the second DC amplifier and ground, the third resistor is connected between an output of the second DC amplifier and an input of the third DC amplifier, the fourth resistor is connected between the input of the third DC amplifier and ground, and wherein the first and second resistors are match resistors for cascading the first and second DC amplifiers, and the third and fourth resistors are match resistors for cascading the second and third DC amplifiers, the offset correction circuit comprising:

an integrator for performing predetermined integration processing for integrating a separation signal separated from an output signal from the first DC amplifier to generate a correction signal and outputting the correction signal to the input of the third DC amplifier, said integrator being connected between the output of the first DC amplifier and the input of the third DC amplifier, wherein the correction signal output from said integrator is combined with an output signal from the second DC amplifier and inputted to the third DC amplifier so that the offset error occurring in the output signal of the DC amplification circuit is corrected.

6. The offset correction circuit according to claim 5, further comprising two resistors connected respectively to input and output of said integrator in series.

7. An offset correction circuit for correcting an offset error occurring in an output signal from a DC amplification circuit caused by temperature instability and power supply variation, said offset correction circuit comprising:

an A/D converter for converting an output signal from a DC amplifier circuit into a time series numeric signal and outputting the numeric signal, said A/D converter being connected to an output stage of the DC amplification circuit; and a processing unit for performing predetermined integration processing for integrating the time series numeric signal output from said A/D converter to generate a time series correction numeric signal and combining the time series correction numeric signal with the time series numeric signal so that the offset error is corrected, said processing unit being connected to an output stage of said A/D converter.

8. A DC amplification circuit comprising:

first and second DC amplifiers;

first and second resistors wherein the first resistor is connected between an output of the first DC amplifier and an input of the second DC amplifier, and the second resistor is connected between the input of the second DC amplifier and ground, and the first and second resistors are match resistors for cascading the first and second DC amplifiers; and an integrator for performing predetermined integration processing for integrating a separation signal separated from an output signal from the first DC amplifier to generate a correction signal and outputting the correction signal to the input of the second DC amplifier, said integrator being connected between the output of the first DC amplifier and the input of the second DC amplifier, wherein an offset error correction function is provided for combining the correction signal output from said integrator with the output signal from the first DC amplifier and inputting the combined signal to the second DC amplifier and correcting an offset error occurring in an output signal, wherein the offset error is caused by temperature instability or power supply variations.

9. The DC amplification circuit according to claim 8, further comprising two resistors connected respectively to input and output of said integrator in series.

10. A DC amplification circuit comprising:

first and second DC amplifiers;

first and second resistors wherein the first resistor is connected between an output of the first DC amplifier and an input of the second DC amplifier, and the second resistor is connected between the input of the second DC amplifier and ground, and the first and second resistors are match resistors for cascading the first and second DC amplifiers; and an integrator for performing predetermined integration processing for integrating a separation signal separated from an input signal to the first DC amplifier to generate a correction signal and outputting the correction signal to the input of the second DC amplifier, said integrator being connected between the input of the first DC amplifier and the input of the second DC amplifier, wherein an offset error correction function is provided for combining the correction signal output from said integrator with an output signal from the first DC amplifier and inputting the combined signal to the second DC amplifier and correcting an offset error occurring in an output signal, wherein the offset error is caused by temperature instability or power supply variations.

11. The DC amplification circuit according to claim 10, further comprising two resistors connected respectively to input and output of said integrator in series.

12. A DC amplification circuit comprising:

first, second, and third DC amplifiers;

first, second, third, and fourth resistors wherein the first resistor is connected between an output of the first DC amplifier and an input of the second DC amplifier, the second resistor is connected between the input of the second DC amplifier and ground, the third resistor is connected between an output of the second DC amplifier and an input of the third DC amplifier, the fourth resistor is connected between the input of the third DC amplifier and ground, and wherein the first and second resistors are match resistors for cascading the first and second DC amplifiers, and the third and fourth resistors are match resistors for cascading the second and third amplifiers; and an integrator for performing predetermined integration processing for integrating a separation signal separated from an output signal from the first DC amplifier to generate a correction signal and outputting the correction signal to the input of the third DC amplifier, said integrator being connected between the output of the first DC amplifier and the input of the third DC amplifier, wherein an offset error correction function is provided for combining the correction signal output from said integrator with an output signal from the second DC amplifier and inputting the combined signal to the third DC amplifier and correcting an offset error occurring in an output signal.

13. The DC amplification circuit according to claim 12, further comprising two resistors connected respectively to input and output of said integrator in series.

14. A DC amplification circuit comprising:

a DC amplifier;

an A/D converter for converting an output signal from said DC amplifier into a time series numeric signal and outputting the numeric signal, said A/D converter being connected to an output stage of said DC amplifier; and a processing unit for performing predetermined integration processing for integrating the time series numeric signal output from said A/D converter to generate a time series correction numeric signal and combining the time series correction numeric signal with the time series numeric signal so that an offset error occurring in an output signal from the DC amplification circuit is corrected, said processing unit being connected to an output stage of said A/D converter.

* * * * *